United States Patent
Ito

[11] Patent Number: 5,925,147
[45] Date of Patent: Jul. 20, 1999

[54] PROCESS FOR PRODUCING SINGLE CRYSTALS

[75] Inventor: Makoto Ito, Kishimagun, Japan

[73] Assignee: Sumitomo Sitix Corporation, Amagasaki, Japan

[21] Appl. No.: 08/769,528

[22] Filed: Dec. 19, 1996

Related U.S. Application Data

[62] Division of application No. 08/545,777, filed as application No. PCT/JP94/00821, May 23, 1994.

[30] Foreign Application Priority Data

| May 31, 1993 | [JP] | Japan | 5-128795 |
| Feb. 17, 1994 | [JP] | Japan | 6-020073 |
| May 13, 1994 | [JP] | Japan | 6-100190 |

[51] Int. Cl.⁶ .......................................... C30B 15/10
[52] U.S. Cl. ........................ 777/15; 117/213; 117/214; 117/218
[58] Field of Search .................. 117/14, 15, 20, 117/201, 202, 213, 217, 218, 900

[56] References Cited

U.S. PATENT DOCUMENTS

| 5,004,519 | 4/1991 | Harir | 117/217 |
| 5,264,189 | 11/1993 | Yamashita et al. | 117/217 |
| 5,363,796 | 11/1994 | Kobayashi et al. | 117/30 |
| 5,441,014 | 8/1995 | Tomioka et al. | 117/213 |
| 5,450,814 | 9/1995 | Shimishi et al. | 127/213 |
| 5,476,065 | 12/1995 | Ikezawa et al. | 117/217 |

FOREIGN PATENT DOCUMENTS

| 0 608 875 | 8/1994 | European Pat. Off. |
| 2139918 | 11/1984 | Japan |
| 62-216990 | 9/1987 | Japan |
| 1-072984 | 3/1989 | Japan |
| 1-100086 | 4/1989 | Japan |
| 4-219386 | 8/1992 | Japan |
| 5294784 | 11/1993 | Japan |
| 6-219886 | 8/1994 | Japan |

OTHER PUBLICATIONS

Patent Abstracts of Japan, vol. 15, No. 500 (C–895), Jan. 24, 1990 & JP 03 218994 A (Mitsubishi Materials Corp.), Sep. 26, 1991, (Abstract).

*Primary Examiner*—Felisa Garrett
*Attorney, Agent, or Firm*—Armstrong, Westerman, Hattori, McLeland & Naughton

[57] ABSTRACT

A process for producing single crystals has been presented which enables the pulling up and growing of single crystals, without loss of accurate control of the oxygen concentration in the crystal, and with excellent dielectric strength of subsequently produced gate oxide films. The process of producing single crystals in accordance with this invention is characterized by confluence of the inert gas flows (33 and 32) once divided into outside and inside a heat resistant and heat insulative component (7).

2 Claims, 5 Drawing Sheets

PROCESS FOR PRODUCING SINGLE CRYSTALS

This is a divisional of application Ser. No. 08/545,777 filed Nov. 27, 1995 now allowed, which is a §371 of PCT/JP94/00821, filed May 23, 1994.

BACKGROUND OF THE INVENTION

1. Field of the Invention

The present invention relates to a device and a process for producing single crystals of silicon (and similar materials) having little contamination or thermal oxidation induced stacking faults, thus enabling the production of wafers whose gate oxide films have excellent dielectric strength. This device and process are also suited for finely controlling the oxygen content of the pulled crystal.

2. Description of the Related Art

Single crystals that are produced according to the Czochralski process contain an appreciable amount of oxygen, which has been melted out of the quartz ($SiO_2$) crucible, as the silicon melt reacts with the quartz crucible. Consequently, during repetitive heat treatment which occurs in the IC and LSI manufacturing processes, this oxygen tends to prevent the occurrence of slips and burrs. Furthermore, during the heat treatments at a temperature of approximately 1000° C., oxide precipitates in the crystal aggregate to form stacking faults of high density and reduce the impurities in the surface layers of wafers cut from the crystal (a phenomenon known as intrinsic gettering).

FIG. 6 schematically illustrates a cross section of a current device and the pulling-process according to the Czochralski technique. The crucible 1 is comprised of a quartz vessel 1a on the inside and a graphite vessel 1b on the outside. A heating element 2 is mounted outside the crucible 1, in which the melt 5, the charge material for the crystal melted by the heating element, is contained. A seed crystal 3 is lowered until it makes contact with the surface of the melt 5 and then is pulled upward to grow a crystal at its lower end. These parts and components are contained in a metallic vessel provided with a water cooling device, all of which constitute a whole device for producing single crystals.

During the course of the single crystal pulling process, inert gas (such as argon gas) of high purity is introduced into the metallic vessel 6 from above at the center, forming a gas flow 30. The gas flow 30 turns into a gas flow 31 containing both silicon monoxide (SiO) that has evaporated from the surface of the silicon melt 5 and carbon monoxide (CO) generated as a result of the silicon monoxide reacting at high temperatures with the graphite components such as the heating element 2, the graphite vessel 1b, etc. The gas flow 31 flows down along the outside and the inside of the heating element 2 to be discharged through the discharge ports 8.

Since the argon gas flow 31 in the metallic vessel 6 is turbulent and locally stagnant, silicon monoxide is deposited on the ceiling of the vessel 6 layer by layer or in particle forms. Fine particles or small blocks of the deposited silicon monoxide fall onto the surface of the melt 5, are incorporated in the boundary layer of the growing crystal and give rise to dislocations in crystal.

Another problem is that, the silicon melt is contaminated also, unless carbon monoxide is properly discharged. That is, the carbon monoxide incorporates into the single crystal, will induce lattice defects in the single crystal.

In order to effectively obviate these problems, two devices mentioned below have been proposed.

FIG. 4 illustrates schematically a pulling assembly (the first device) proposed by the U.S. Pat. 4,330,362: Kokoku No. 57-40119. This device is characterized by having an upper flat annular rim 7a projecting beyond the crucible edge and a joining piece 7b attached to this annular rim 7a and extending downwardly and conically from its inner edge, the joining piece 7b *being* 0.2 to 1.2 times as high as the crucible 1.

FIG. 5. illustrates schematically another pulling assembly (the second device) disclosed in Kokai No. 64-72984. This device is characterized by having a heat resistant and heat insulating cylinder 10 that extends downward coaxially surrounding the single crystal 4 being pulled and is tightly joined to the subvessel 6c at its junction with the metallic vessel 6. The device is also characterized by having a heat resistant and heat insulating annular plate 11, which closely rests on the upper end of the heat insulating component 12 and has an outside diameter nearly identical with that of the heat insulating component 12, the inside diameter of which tightly fits the above mentioned heat resistant and heat insulating cylinder 10.

The first and the second devices as mentioned above effectively increase the pulling rate by shielding the crystal pulled from heat irradiation and they prevent fine particles of silicon monoxide from falling into the melt, and suppress generation of the thermal oxidation induced stacking faults (OSF). However, these devices do not solve the problems of enhancing the dielectric strength of the oxide films of the wafers which are cut from the crystal. And without improving the dielectric strength, it is impossible to produce a small highly integrated semiconductor. In addition, these devices can not solve the problem of having an adverse effect on controlling the oxygen concentration in the crystal.

The exact mechanism of formation of faults, which deteriorate the dielectric strength of the oxide films, has not yet been clarified. It has been reported that the cores of faults in crystals, which constitute the origin of the defects in the dielectric strength of the oxide films, are formed during the crystal growth, the cores contracting at the high temperature stage (above 1250° C.) and grown at the low temperature stage (below 1100° C.) (See 30P-ZD-17, The Japan Society of Applied Physics Extended Abstracts, The 39th Spring Meeting, 1992). In short, the dielectric strength of the oxide films are known to depend on the thermal history immediately after crystal pulling.

In the first device as schematically illustrated in FIG. 4, the internal clearance of the circular truncated cone 7b located surrounding the crystal being pulled is as low as 0.2 to 1.2 times that of the crucible. Thus immediately after a crystal grows it is exposed to the low temperature atmosphere in the metallic vessel, and is cooled too rapidly to facilitate shrinkage of the defect cores. As the result the dielectric strength of the oxide films deposited on the wafers cut from the crystal is deteriorated.

In the second device as schematically illustrated in FIG. 5, since the heat resistant and heat insulating cylinder 10 is tightly joined to the water cooled metallic vessel 6 and the subvessel 6c at their junction, the internal surface of the heat resistant and heat insulating cylinder 10 is cooled by thermal conduction, a rapid cooling takes place at the high temperature stage immediately after crystal growing. Hence, immediately after the crystal grows only a slight shrinkage of the defect clusters occurs and as a result the dielectric strength of the oxide films are deteriorated.

While the oxygen concentration in the single crystal is required to be brought under control to the accuracy of ±0.75×10$^{17}$ atoms/cm$^8$ from the target value in order to effectively carry out gettering action about oxygen in the single crystals as mentioned before, it is strongly influenced by the state of the above mentioned argon gas flow.

The flow velocity of the argon gas (Vg) depends on the gas supply pressure (Pg), the gas flow rate (Qg), the gas passage cross section (Ag) and the internal furnace pressure (Pf). This relationship can be described by the formula (A) given below.

$$Vg=(Qg/Ag)\times(Pg/Pf) \quad \ldots (A)$$

This gas flow velocity (Vg) significantly influences the contamination of the single crystals by the silicon monoxide that evaporates from the surface of the melt.

Since in the first device illustrated in FIG. 4, the circular truncated cone 7b, the flat annular rim 7a, and the circular cylinder 13 are tightly connected to each other, the entire argon gas flow from the upper side of the pulling chamber forms a gas flow 31 that passes inside the joining piece 7b to the narrow gap between the bottom portion of the joining piece 7b and the surface of the melt 5, after which it flows downward along the inside and the outside surfaces of the heater 2.

Since, as mentioned before, the argon gas flow from the pulling chamber is turbulent, the influence of the upward flow of the silicon monoxide that evaporates from the surface of the melt 5 upon the argon gas flow is not uniform along the circumference of the joining piece 7b. Hence the outward flow of the argon gas at the lower end of the joining piece 7b is not circumferentially uniform, rather there is variation in the velocity of the the argon gas flow (Vg) between the lower end of the joining piece 7b and the surface of the melt 5 depending on the location along the circumference of the joining piece 7b.

When, in the first device shown in FIG. 4, the argon gas flow rate (Qg) is enhanced and the gas flow velocity (Vg) is increased, sufficient discharge of the silicon monoxide and the carbon monoxide can be obtained, thus preventing them from contaminating. However, since, the flow velocity (Vg) in the gap between the end of the joining piece 7b and the surface of the melt 5 subsequently increases, the local variation of the flow velocity increases, depending on the circumferential position. And variation in the surface temperature and the convection in the melt 5 is induced, making it difficult to control the oxygen concentration in the crystal within a certain range with desirable accuracy and reproducibility.

As the flow velocity (Vg) in the gap between the lower end of the joining piece 7b and the surface of the melt 5 increases, the surface of the melt 5 tends to vibrate, leading to a situation where it is impracticable to carry out drawing a dislocation-free single crystal.

On the other hand, when the argon gas flow rate (Qg) is reduced and the gas flow velocity (Vg) is lowered, the variation in the flow velocity (Vg) in the gap between the lower end of the joining piece 7b and the surface of the melt 5 decreases, hence control over the oxygen concentration is improved. However, decrease in the gas flow velocity (Vg) entails a certain loss in capability to discharge silicon monoxide and carbon monoxide, raising the problem of contamination of the silicon melt 5 by silicon monoxide particles and carbon monoxide.

The problem mentioned above exists not only with the first device but also with the second device illustrated in FIG. 5, and is a problem common to existing devices. In short, with existing devices there are difficulties in providing the dielectric strength of the oxide films for the highly integrated micro-semiconductor or in accurately controlling the oxygen concentration in the crystal.

SUMMARY OF THE INVENTION

The present invention aims to provide a device and a process that enables production of single crystals from which wafers whose oxide films are superior in the dielectric strength can be produced. This is accomplished by a pulling up technique by which an adequate temperature distribution in the direction of withdrawing the single crystal is formed, contamination of the single crystal is avoided, and the accurate control of the oxygen concentration in the single crystal is maintained.

The aims of this invention are achieved by providing (1) the device for producing single crystals of silicon as described below and (2) the method as described below for producing single crystals by the use of this device.

(1) FIG. 1 illustrates the device for producing the single crystals. The device is characterized by and comprising: the crucible 1 which contains the melt 5, of the charge material for the single crystal to be grown, the heating element 2 to heat the melt 5, the withdrawing measure 9 to grow the single crystal 4 after bringing the seed crystal 3 into contact with the melt 5, and a metallic vessel 6 which contains all of the constituents described above, wherein a cylinder or a circular truncated cone narrowing downward constituting of heat resistant and heat insulating component surrounding the zone of crystal withdrawing is suspended from the ceiling 6a or supported by the upper part of the side 6b of the metallic vessel 6 with a gap $h_1$ between the upper edge of the above mentioned component 7 and the ceiling of this metallic vessel 6, through which the inert gas supplied from the upper part of the vessel 6 can be divided into the inert gas flow 33 flowing down along the inside of the component 7 and the inert gas flow 32 flowing down along the outside of the component 7.

(2) In the process of producing single crystals making use of the device to produce single crystals provided with: the crucible 1 which contains the melt 5 of the charge material for the single crystal to be grown, the heating element 2 to heat the melt 5, the withdrawing measure 9 to grow the single crystal 4 after bringing the seed crystal 3 into contact with the melt 5, and a metallic vessel 6 which contains all of the constituents as described above, where a cylinder or a circular truncated cone narrowing downward constructed of heat resistant and heat insulating component 7 surrounding the zone of crystal withdrawing is suspended from the ceiling 6a or supported by the upper part of the side 6b of the metallic vessel 6 above the melt 5 in the crucible 1 with a gap $h_1$ between the upper edge of the above mentioned component 7 and the ceiling of this metallic vessel 6, through which the inert gas 30 supplied from the upper part of the vessel 6 can be divided into the inert gas flow 33 flowing down along the inside of the component 7 and the inert gas flow 32 flowing down along the outside of the component 7, after which the process of producing single crystal is characterized by bringing the divided flows of the inert gas into confluence.

The heat resistant and heat insulating component 7 described in (1) and (2) above preferably is made of graphite and coated with silicon carbide. The gap ($h_1$) between the upper edge of the component 7 and the ceiling 6a of the vessel 6 preferably is adjustable within a range of 5 mm–100 nm so that the rate of the inert gas flow through the gap, namely the flow velocity, may be adjusted.

DESCRIPTION OF THE PREFERRED EMBODIMENT

The device and the process in accordance with this invention are explained referring to figures below.

Figure 1A:
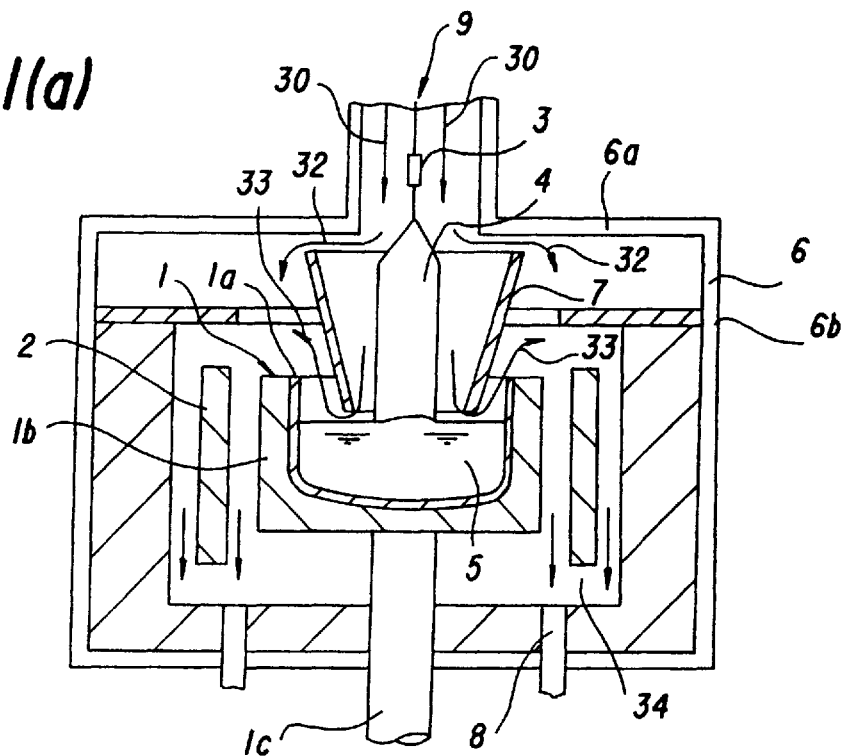
FIG. 1 is an illustration of the device in accordance with this invention; (a) showing a cross section, and (b) showing an enlarged view of the key portion.

FIG. 1 is an illustration of the device in accordance with this invention, (a) showing a cross section of the device, and (b) showing an enlarged view of the key portion. The crucible 1 is illustrated in FIG. 1(a), and consists of a dual structure in which the inside is a quartz vessel 1a, and the outside is a graphite vessel 1b which are placed on the crucible supporting shaft 1c. This crucible supporting shaft 1c is made in such a way that it may be rotated and raised or lowered in addition to supporting the crucible.

In FIG. 1, the metallic vessel 6 provided with a water cooling device, is a cylindrical vacuum chamber consisting of the ceiling 6a and the side wall 6b provided with a shaft for withdrawing of a single crystal aligned with the center line, the crucible 1 being positioned in its middle and surrounded by a heater 2. Above the crucible 1, a withdrawing measure 9 that can be turned around and raised or lowered is suspended from the center of the ceiling 6a of the metallic vessel, and a seed crystal 3 is placed at its lower end. The seed crystal 3 is pulled up as it is turned around by the withdrawing measure 9, and a single crystal 4 is grown at its lower tip where it makes contact with the melt 5.

Figure 1B:
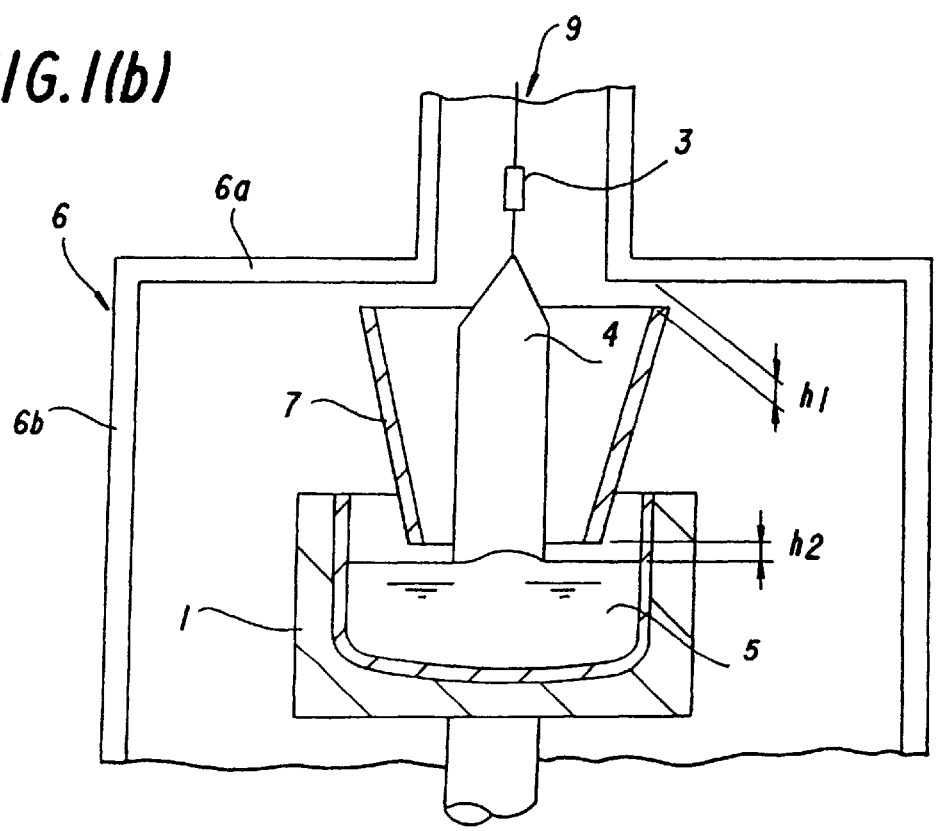

As is illustrated in FIG. 1(b), a conical heat resistant and heat insulating component 7 is sustained coaxially with the withdrawing measure 9, not in contact with the ceiling 6a of the metallic vessel 6 but with a gap ($h_1$) between the upper edge of the heat resistant and heat insulating component 7 and the ceiling 6a so that the inert gas, preferably argon gas, may flow through it. The heat resistant and heat insulating component 7 is placed surrounding the withdrawing zone of the single crystal with a gap ($h_2$) between the lower edge of the heat resistant and heat insulating component 7 and the surface of the melt 5.

Figure 2A:
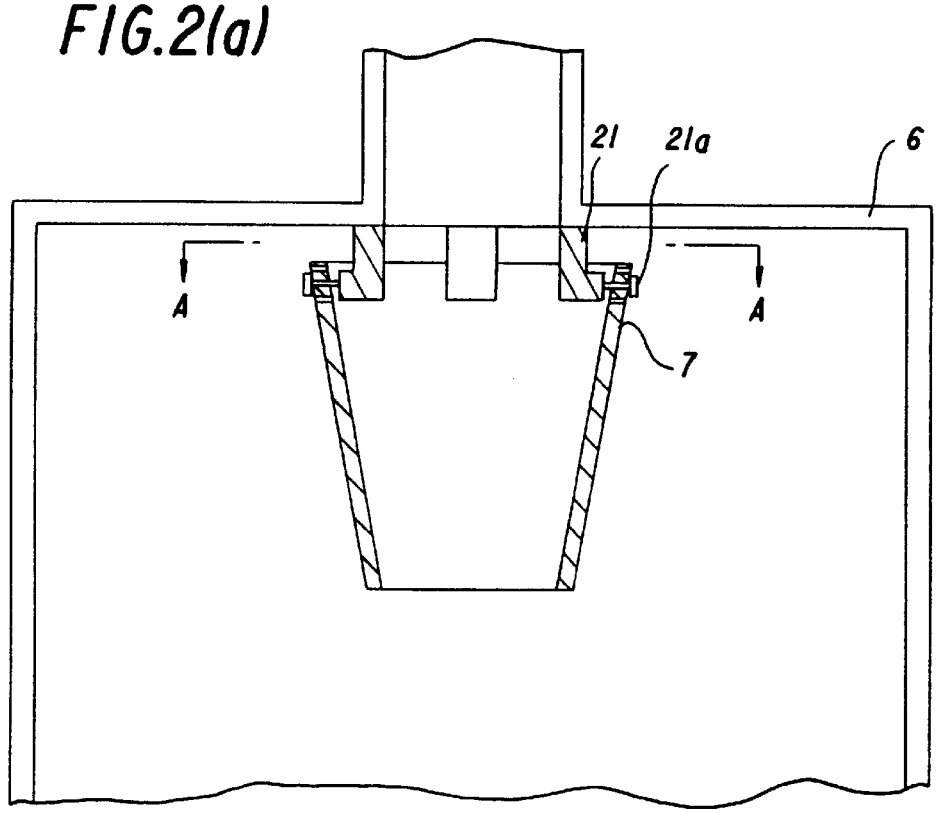
FIG. 2 is an illustration of an example of one way to support the heat resistant and heat insulating part; (a) being a side view section, (b) being a top view, and (c) being a bird's-eye view from the top and to one side.
Figure 2B:
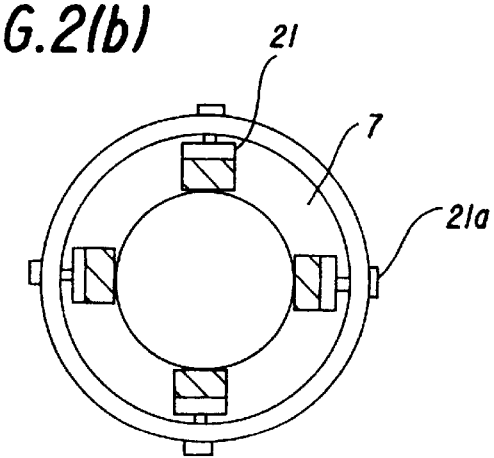
Figure 2C:
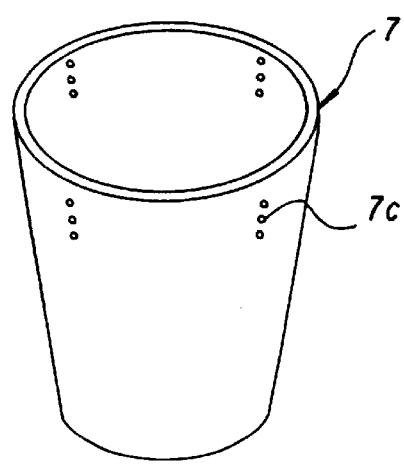

FIG. 2 illustrates an example of how the heat resistant and heat insulating component 7 is held by the suspending part 21. FIG. 2(a) shows a longitudinal section of the support by the suspending part 21, and FIG. 2(b) shows a horizontal section in A—A view. FIG. 2(c) shows a bird's-eye view of the heat resistant and heat insulating component 7. In this example, four pieces of square support rods 21 are placed at 90° to one another on the ceiling 6a of the metallic vessel 6, and the support rods and the tying bolts 21a hold the upper portion of the heat resistant and heat insulating component 7. By this means the heat resistant and heat insulating component 7 is suspended so that the upper edge of the heat resistant and heat insulating component 7 does not touch the ceiling 6a, and the gaps are secured to allow the argon to flow both to the outside and inside of the heat resistant and heat insulating component 7. The number of the suspending parts 21 is not necessarily limited to four(4) as above, nor must the shape of suspending parts 21 be a square rod either.

As is illustrated in FIG. 2(c), there are a number of supporting penetration holes 7c to accommodate the above mentioned bolts 21a in the heat resistant and heat insulating component 7. They are provided to allow freedom of selection of supporting penetration holes in order to adjust the gap ($h_1$) between the upper edge of the heat resistant and heat insulating component 7 and the ceiling 6a. The penetration holes are not, of course, limited to within the scope as is illustrated.

Figure 3A:
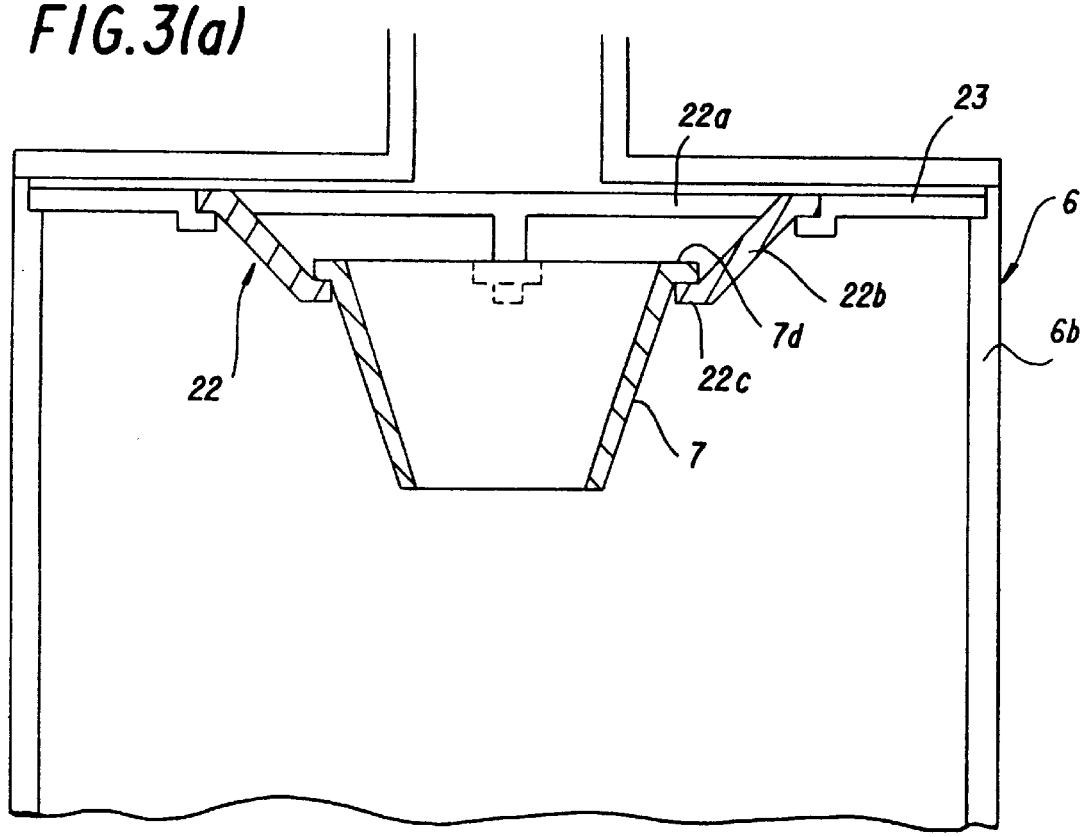
FIG. 3 is an illustration of another example of a way to support the heat resistant and heat insulating component; (a)being a side view section, (b) being a bird's-eye view of the supporting legs, and (c) being a bird's-eye view of the heat resistant and heat insulating component supported by the supporting legs.
Figure 3B:
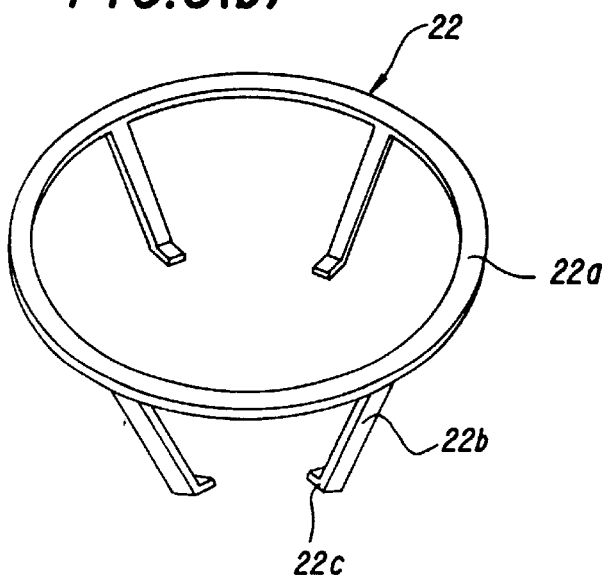
Figure 3C:
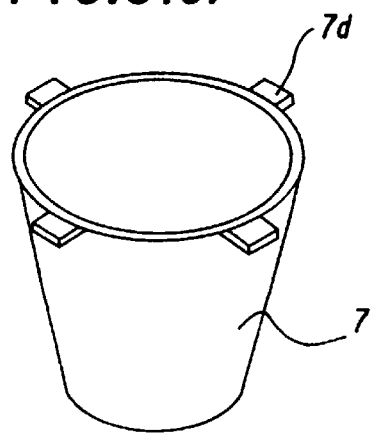

FIG.3 illustrates another example in which the heat resistant and heat insulating component 7 is suspended with supporting legs 22 and the heat resistant and heat insulating component 7 is held on the side wall 6b of the metallic vessel 6. FIG. 3(a) shows a longitudinal section of the support by the supporting legs 22, and FIG. 3(b) shows a bird's-eye view of the supporting leg 22, which consists of the upper end ring 22a and four (4) sets of supporting leg 22b and end tips 22c. FIG. 3(c) shows a bird's-eye view of the heat resistant and heat insulating component 7 suspended by the supporting legs 22, and four (4) protrusions 7d are placed on its upper circular edge.

In this example, the supporting leg 22 is held by the retaining ring 23 provided on the side wall 6b of the metallic vessel 6 setting the upper end ring 22a. Next, the heat resistant and heat insulating component 7 is held in position at a distance from the ceiling 6a by hooking the protrusions 7d of the heat resistant and heat insulating component 7 on the end tips 22c of the supporting leg 22. The adjustment of the gap ($h_1$) between the upper end of the heat resistant and heat insulating component 7 and the ceiling 6a is carried out by controlling the length and the angle of the leg 22b of the supporting leg 22. As in the case of FIG. 2, the shape of the supporting legs 22 and the number of the legs 22b are not limited to those shown in this example.

As can be observed from FIG. 2 and FIG. 3, the only requirement for the structure of the supporting components is to have clearance between the upper end of the heat resistant and heat insulating component 7 and the ceiling 6a. The gap between the upper end of the heat resistant and heat insulating component 7 and the ceiling 6a is intended to divide the flow of argon gas supplied from the upper part of the metallic vessel 6 into both a downward flow in the inside and another flow on the outside of the heat resistant and heat insulating component 7. The purpose of this invention is achieved as long as the heat resistant and heat insulating component 7 is supported with such supporting components from the ceiling 6a or from the side wall 6b of the metallic vessel 6.

In either example it is preferable that the heat resistant and heat insulating component 7 be constructed from graphite, that its shape be either cylindrical or circular truncated cone narrowing from upper to lower end, and that its surface be coated with silicon carbide. Graphite is chosen for the material of the heat resistant and heat insulating component 7, because a component of high purity is obtainable for ease of protecting the pulled crystal from contamination with heavy metals. In addition, coating the surface with silicon carbide prevents release of gas from the pores in the graphite components and also prevents reaction of the silicon monoxide that evaporates from the surface of the melt 5 with the graphite components.

In order to produce a single crystal of good dielectric strength of the oxide films, it is necessary to adequately control the cooling rate in the pulled-up crystal, in particular to have adequate control of the cooling rate of crystal at the high temperature stage immediately after growing the crystal. Therefore, in the device and the process in accordance with this invention the heat resistant and heat insulating component 7 is extended in a wide range around the withdrawing range from the surface of the melt 5 in the crucible to the ceiling 6a of the metallic vessel 6. In addition the heat resistant and heat insulating component 7 is installed with an adequate gap between itself and the ceiling 6a of the water cooled metallic vessel 6 and is not tightly jointed to the ceiling.

Figure 4:
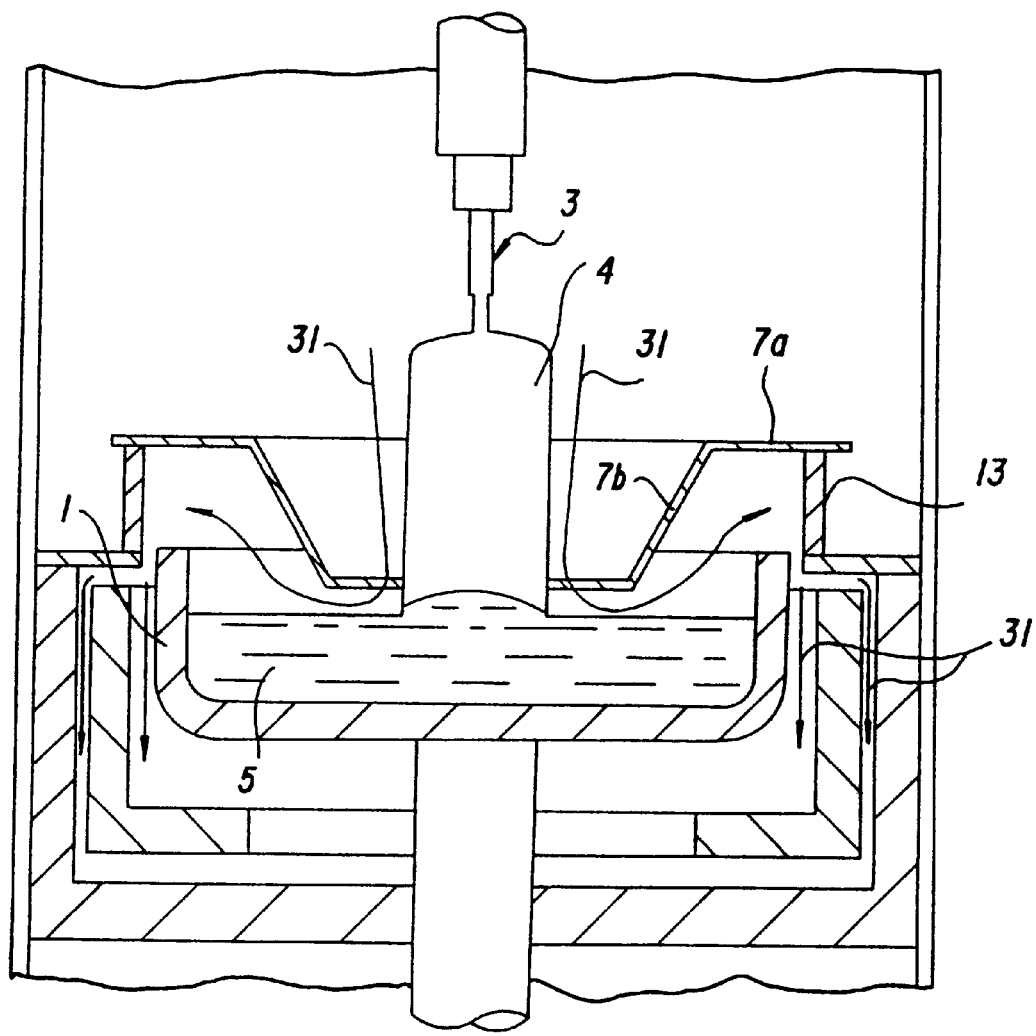
FIG. 4 is a side view section of an example of a conventional device for producing single crystals.

Compared with the low internal height of the connection 7b as in the device shown in FIG. 4, as a result of this structure, immediately after crystal growing the crystal is not directly exposed to the low temperature atmosphere.

Figure 5:
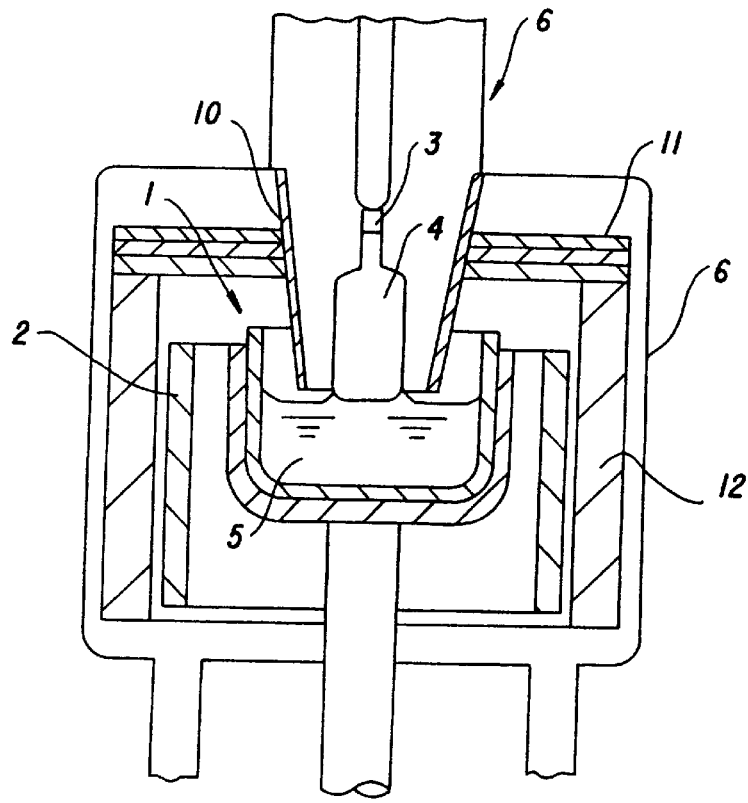
FIG. 5 is a side view section of another example of a conventional device for producing single crystals.
Figure 6:
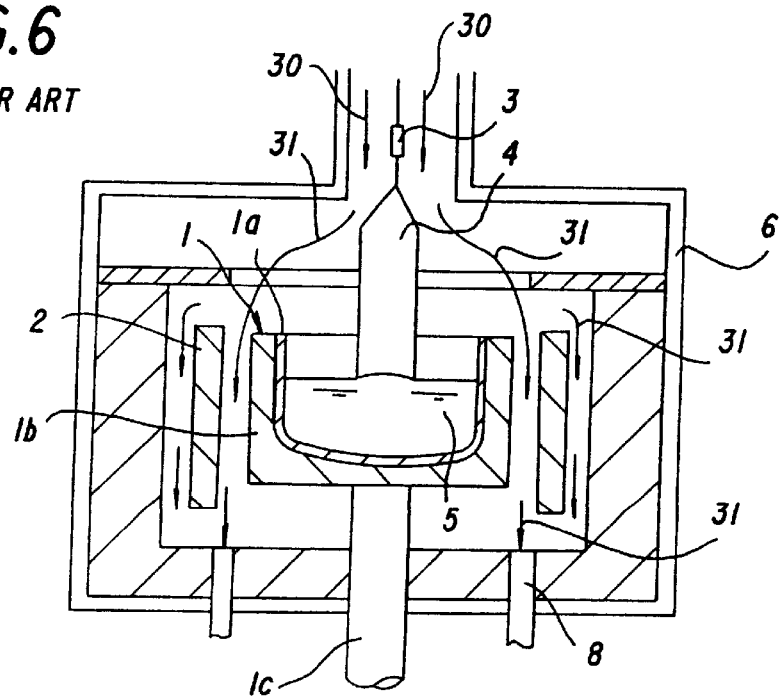
FIG. 6 is a schematic cross section illustrating a device and process for producing a single crystal in accordance with the Czochralski process.

Compared with the device illustrated in FIG. 5 where the heat resistant and heat resistant and heat insulating component 10 is closely connected to the ceiling of the metallic vessel 6, temperature decrease due to thermal conduction is prevented, therefore the inside surface of the heat resistant and heat insulating component 7 also can be maintained at higher temperature. Hence the device and the process in accordance with this invention enable reduction of the cooling rate immediately after crystal growing, to cool the single crystal slowly at the high temperature stage above 1100° C., and to improve the dielectric strength of subsequently produced gate oxide films.

As is illustrated in FIG. 1(a), the flow of argon gas 30 supplied from the upper part of the metallic vessel 6 is divided into a gas flow 33 flowing down inside the heat resistant and heat insulating component 7 and into another gas flow 32 flowing down outside the heat resistant and heat insulating component 7 out of the gap between the upper end of the heat resistant and heat insulating component 7 and the ceiling 6a. The divided gas flow 32 and 33 rejoin to form a gas flow 34 which flows between the crucible 1 and the heater 2 and outside the heater 2 to be discharged along with silicon monoxide and carbon monoxide through the discharge port 8. Therefore, ever if the gas flow velocity is reduced by diminishing the rate of gas flow 33 in order to limit the local difference in the flow velocity generated in the argon flow between the lower end of the heat resistant and heat insulating component 7 and the surface of the melt 5, the flow velocity beyond a certain value for the confluence of gas 34 toward the discharge port 8 can be secured, as long as a sufficient rate of the downward gas flow 32 outside the heat resistant and heat insulating component 7 is maintained. Consequently, both the oxygen concentration in the crystal can be controlled with high degree of accuracy and the silicon monoxide and carbon monoxide can be adequately discharged.

The gap ($h_1$) between the upper edge of the heat resistant and heat insulating component 7 and the ceiling 6a is preferably set in the range from 5 mm to 100 mm. For $h_1$ less than 5 mm the gas flow 33 becomes dominant and the local variation in the flow of the argon gas between the lower end of the heat resistant and heat insulating component 7 and the surface of the melt 5 increases, generating variation in the surface temperature of the melt 5 and the convection of the melt 5, thus making it hard to precisely control the oxygen concentration in the crystal. For $h_1$ larger than 100 mm on the other hand, influenced by the water cooled metallic vessel 6, the cooling rate of the pulled-up crystal 4 is too rapid and the dielectric strength of subsequently produced gate oxide films deteriorates. Furthermore, the desirable setting for $h_1$ is less than 30 mm. With $h_1$ greater 30 mm, the gas flow 33 flowing to the discharge port 8 becomes reversed or stagnant, and a part of the evaporated silicon monoxide is deposited in the metallic vessel 6 where it might fall into the melt 5.

The gap ($h_2$) between the lower edge of the heat resistant and heat insulating component 7 and the surface of the melt 5 is preferably between 10 mm and 50 mm. For $h_2$ larger than 50 mm, the crystal pulling rate has to be reduced, because the influence upon the crystal of the thermal radiation from the heater and the melt becomes excessive. With $h_2$ in the range between 10 and 50 mm, the flow of argon gas between the lower edge of the heat resistant and heat insulating component 7 and the surface of the melt 5 is uniform, and also the heat insulating effect upon the pulled crystal is secured.

As mentioned above, it is essential to minimize the local fluctuation in the velocity of the argon gas flow above the surface of the melt 5 in order to accurately control the oxygen concentration in the crystal within $\pm 0.75 \times 10^{17}$ atoms/cm$^3$. Continuous control of the gas flow velocity is realized by adjusting the gap $h_1$ between the upper end of the heat resistant and heat insulating component 7 and the ceiling 6a and by adjusting the gap $h_2$ between the lower end of the heat resistant and heat insulating component 7 and the surface of the melt 5.

Prior to processing a single crystal in the device in accordance with this invention, first the gaps $h_1$ and $h_2$ are to be set to deliver the appropriate flow velocity and rate of flow, depending on the dimensions, the pulling rate, the required oxygen concentration in the crystal and other process conditions, and then the production of the single crystal is to be carried out.

A preferable embodiment of this invention is described above. In the paragraphs below the effects of this invention are described.

In a manufacturing device assembled in accordance with this invention as illustrated in FIG. 1(a) and (b), the heat resistant and heat insulating component 7 is made of a circular truncated cone with a height of 380 mm, an inside diameter of 400 mm at the upper end, an inside diameter of 200 mm at the lower end, and a thickness of 10 mm. In FIG. 2(a) the upper end of the heat resistant and heat insulating component 7 and the ceiling 6a of the metallic vessel 6 are separated by a gap $h_1$ of 10 mm, and the lower end of the heat resistant and heat insulating component 7 and the surface of the melt 5 are separated by a gap $h_2$ of 30 mm supported with the supporting legs 21 nearly concentrically with the withdrawing measure 9 of the single crystal.

The material of the heat resistant and heat insulating component 7 was graphite and its surface was coated with silicon carbide.

The pulled crystals 4 were silicon single crystals 6 inches in diameter, the quartz crucible 1a used was 406 mm (16 inches) in diameter, the rate of argon gas flow into the metallic vessel 6 was set at 60 liter/min, the rate of pulling up was 1.1 mm/min, and the length of the pulled crystals was 1200 mm. For the purpose of comparison, other sample crystals were pulled up in the device illustrated in FIG. 4 (the first device) under the same conditions.

The single crystal products were evaluated in terms of; the yield ratio of dislocation-free single crystals; the OSF acceptance ratio; the dielectric strength of gate oxide films acceptance ratio; and the oxygen concentration acceptance ratio. In this demonstration the yield ratio of the dislocation-free single crystals was represented by the ratio of the weight of the dislocation-free single crystal after excision of the portion with dislocation, to the weight of the original charged polycrystalline material.

The OSF acceptance ratio was represented by the ratio of the number of wafers of acceptable OSF to the total numbers of wafers, with the criteria of acceptance to be less than the standard number of OSF defects (10 defects/cm$^2$) after cutting silicon wafers out, and putting them through heat treatment of 780° C. for 3 Hr, and 1000° C. for 16 Hr, followed by selective etching. The acceptance ratio of the dielectric strength of gate oxide films was evaluated in terms of the voltage ramping procedure with a gate electrode consisting of phosphorus (P)-doped polycrystalline silicon with a 250Å thick dry oxide film and an area of 8 mm$^2$. The criteria for acceptance was to withstand dielectric strength above the standard value (8 MV/cm of the mean electric field) before an avalanche. The result was represented by the ratio of the number of acceptable wafers to the total number of wafers tested.

In addition, single crystals pulled up, free from dislocation and with oxygen content within $\pm 0.75 \times 10^{17}$ atoms/cm$^8$ were determined to be of acceptable oxygen content, and the ratio of acceptance is represented by the ratio of the weight of the single crystals of acceptable oxygen content to the weight of dislocation-free single crystals.

For these tests, a total of 34 crystals were pulled up using this invention and, for comparison, the device illustrated in FIG. 4 (the first device). The results of the above tests are shown in Table 1:

TABLE 1

| Test Items | Results in Acceptance with This Invention | Results by Tests for Comparison |
|---|---|---|
| Yield Ratio, Dislocation-Free Single Crystals | 78.3% | 77.8% |
| OSF Acceptance Ratio | 98.6% | 92.1% |
| Acceptance Ratio, Dielectric Strength of Gate Oxide Films | 86.5% | 51.8% |
| Acceptance Ratio, Oxygen Content | 96.0% | 83.9% |

It can be seen that, all the test results for single crystals prepared with the device and by the process in accordance with this invention demonstrate better characteristics than those of the products for comparison, and a particularly remarkable difference can be seen in the acceptance ratio of the dielectric strength of gate oxide films.

APPLICABILITY FOR INDUSTRIAL USE

In accordance with this invention, it is possible to both divide and to control confluence of the gas flow. Furthermore it is possible to control the cooling rate of the crystal in the direction of withdrawing the single crystal.

By these means, intrusion of contaminants into the single crystal can be prevented and improvement of dielectric strength of the gate oxide films produced from the single crystal as well as precise control of the oxygen concentration in the crystal can be attained. Therefore this invention is applicable in metal fabrication and semiconductor industries as a device and a process for producing single crystals.

I claim:

1. In a method of producing single crystals by using a device for producing single crystals comprising: a crucible containing a melt of material from which single crystals are to be grown, a heating element to heat said melt, a withdrawing measure to bring a seed crystal once into contact with the surface of said melt in said crucible and pull up said single crystal, and a metallic chamber to contain each of said components; a method of producing single crystals characterized, by installing a cylinder or a circular truncated cone with downwardly reduced diameter of heat resistant and heat insulating component surrounding the pulling zone of said single crystal and above said melt in said crucible, a gap being provided between said component and the ceiling of said metallic chamber to make the gas flow, by flowing the inert gas supplied from the upper part of said chamber to divide said flow into the inert gas flow downward inside said component and the inert gas flow downward outside, and by making confluence of divided gas flows later.

2. The method of producing single crystals according to claim 1 wherein said gap between the upper end of said heat resistant and heat insulating component and said metallic chamber characterized by being adjustable.

* * * * *